United States Patent [19]

Ito et al.

[11] 4,270,394
[45] Jun. 2, 1981

[54] TONING SHAFT FOR A ROTARY SWITCH

[75] Inventors: Katsuo Ito; Bunjiro Murata; Kazunori Yoshimura, all of Kanazawa, Japan

[73] Assignee: Murata Manufacturing Co., Ltd., Nagaokakyo, Japan

[21] Appl. No.: 912,767

[22] Filed: Jun. 5, 1978

[30] Foreign Application Priority Data

Jun. 16, 1977 [JP] Japan .............................. 52-79635[U]
Jun. 16, 1977 [JP] Japan .............................. 52-79636[U]

[51] Int. Cl.³ ............................................ F16H 35/18
[52] U.S. Cl. ................................. 74/10 R; 74/10.54; 74/553; 116/DIG. 29; 200/336; 334/47; 428/399
[58] Field of Search ................... 74/10 R, 553, 10.54; 200/336, 153 M; 428/36, 376, 399; 116/245, 249, 241, DIG. 29; 334/47, 49, 50

[56] References Cited

U.S. PATENT DOCUMENTS

| 2,197,140 | 4/1940 | Arvin | 74/553 X |
|---|---|---|---|
| 2,659,336 | 11/1953 | Insul | 116/DIG. 29 |
| 3,013,584 | 12/1961 | Reed et al. | 428/36 |
| 3,193,312 | 7/1965 | Ehner | 74/553 |
| 3,728,511 | 4/1973 | George et al. | 200/336 |
| 3,754,478 | 8/1973 | Perlino | 74/553 |
| 3,760,640 | 9/1973 | Mayer et al. | 74/10.54 |
| 3,839,917 | 10/1974 | Newberry | 116/249 X |
| 3,844,176 | 10/1974 | Valdettaro | 74/10.54 X |
| 3,978,438 | 8/1976 | Aoki | 334/47 |
| 3,987,680 | 10/1976 | Naoi et al. | 74/10.54 |
| 3,990,013 | 11/1976 | Badger | 74/10 R |
| 4,062,315 | 12/1977 | Siokmen | 116/DIG. 29 |

FOREIGN PATENT DOCUMENTS 1131478 6/1962 Fed. Rep. of Germany ............. 74/553

Primary Examiner—Werner H. Schroeder
Assistant Examiner—Andrew M. Falik
Attorney, Agent, or Firm—Birch, Stewart, Kolasch & Birch

[57] ABSTRACT

A rotary type television tuner includes a chassis and a channel changing shaft extending through the chassis and having an operating knob mounted on the front end thereof for rotating the shaft. The channel changing shaft is made of a synthetic resin reinforced with glass fiber and is circular in cross-section over the greater part, the knob mounting section being formed with a flat portion and having a cross-section that is nearly semicircular. The root of the flat portion of the knob mounting section is rounded. A reinforcing rod assembly comprising a reinforcing rod made of a metal and a reinforcing rod made of a rigid synthetic resin which are connected together as by threads is embedded in the channel changing shaft including its knob mounting section. The length of the reinforcing rod of metal is such that when it is assembled as the tuner, it extends from the front end nearly to the chassis plate.

34 Claims, 17 Drawing Figures

TONING SHAFT FOR A ROTARY SWITCH

BACKGROUND OF THE INVENTION

1. Field of the Invention

This invention relates to a rotary shaft for a rotary switch and more particularly it relates to a channel changing shaft for a television tuner or channel selector, said rotary shaft being molded of a synthetic resin.

2. Description of the Prior Art

Figure 1:
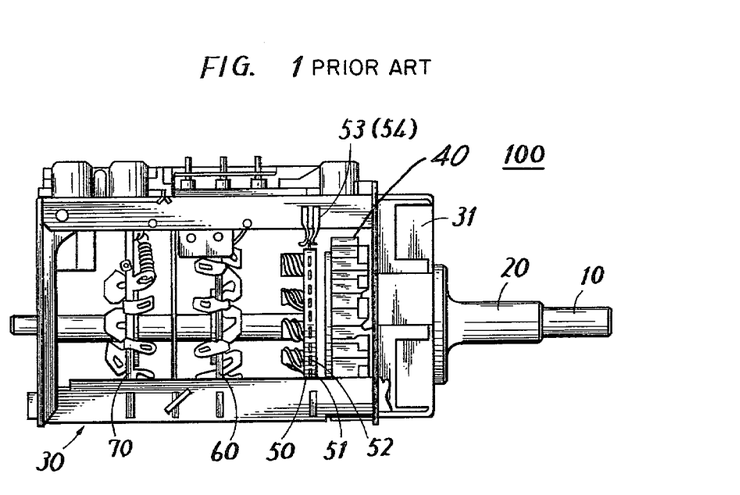
FIG. 1 is a side view of an example of a known preset type rotary type television tuner, which forms the backgrond of the invention.

A rotary type television tuner, such as one shown at 100 in FIG. 1, has already been widely known. As known in the art, the television tuner 100 includes a channel changing shaft 10. A detent rotor 40 for intermittent positioning, and a changing plate 50 are fixedly mounted on the shaft 10 so that they can be rotated integrally with the shaft 10. The channel changing shaft 10 is inserted in holes in switching plates 60 and 70 which have tuning elements attached thereto and are fixed to a chassis 30. The chassis 30 is made up of chassis component plates and accommodates the detent rotor 40, changing plate 50 and switching plates 60 and 70, with a presetting mechanism 31 provided at one end thereof. The presetting mechanism 31 has a fine tuning shaft 20 connected thereto. The fine tuning shaft 20 is rotatably mounted on the channel changing shaft 10 to provide for fine tuning which is effected by rotating the same.

Figure 2:
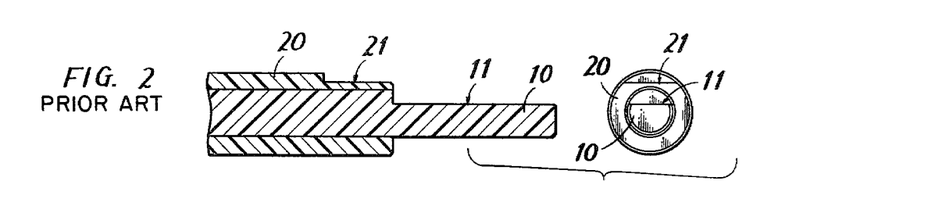
FIG. 2 is a view showing the cross-sectional construction of the front end portion of a conventional channel changing shaft.

The channel changing shaft 10, which is circular in cross-section, is formed with a flat portion 11 for mounting unillustrated knob thereon, as shown in FIG. 2. The rotation of the knob mounted on the front end of the shaft 10 causes the rotation of the changing plate 50, whereby of the terminals 51 and 52 which are formed on the outer periphery of the changing plate 50, a selected pair of terminals are clamped by contact clips 53 and 54, whereby a change to a desired channel is effected.

Conventionally, the channel changing shaft 10 of such rotary type television tuner 100 has been made of iron or other metals. However, metals are difficult to work with and working them into complicated shapes, especially a flanged part for turning the changing plate 50, is difficult. Further, since such working is performed by turning the shaft down in a lathe, it entails a materials loss, and in the case of iron, a surface treatment, such as plating, for rust proofing is required. Which adds to the cost. In particular, when the shaft 10 is assembled to the television tuner, it is necessary to provide accessories such as grounding springs used to assure that the chassis 30 and shaft 10 are at the same potential (ground potential) and end insulators required by safety standards to prevent the exposure of metal at the knob.

It may be easily thought of to employ synthetic resins in producing the channel changing shaft. However, a simple changeover of materials from metal to synthetic resin would not be sufficient. In the case of a television tuner as contrasted with communication equipment, for example, the knob is subject to rough manipulation. In such case, there would arise a new problem of such synthetic resin shaft being broken adjacent the knob, which is not a problem with the metal shaft.

SUMMARY OF THE INVENTION

A rotary type switch includes a rotary changing part and a rotary shaft for manipulating said part for changeover. The rotary shaft is formed circular in cross-section by molding a synthetic resin, and in order to mount an operating knob thereon, the front end portion of the shaft is formed with a flat portion which extends axially of the shaft. The root of the flat portion of the rotary shaft is rounded so that it is gradually inclined. Preferably, the rotary shaft has a longitudinally extending hard reinforcing member embedded therein.

Accordingly, a principal object of the present invention is to provide a rotary shaft for a rotary switch which is made of a synthetic resin and yet has a sufficient mechanical strength.

Another object of the invention is to provide an inexpensive rotary shaft for a rotary switch.

These and other objects and features of the invention will become more apparent from the following detailed description to be given with reference to the accompanying drawings.

DETAILED DESCRIPTION OF THE PREFERRED EMBODIMENTS

Figure 3:
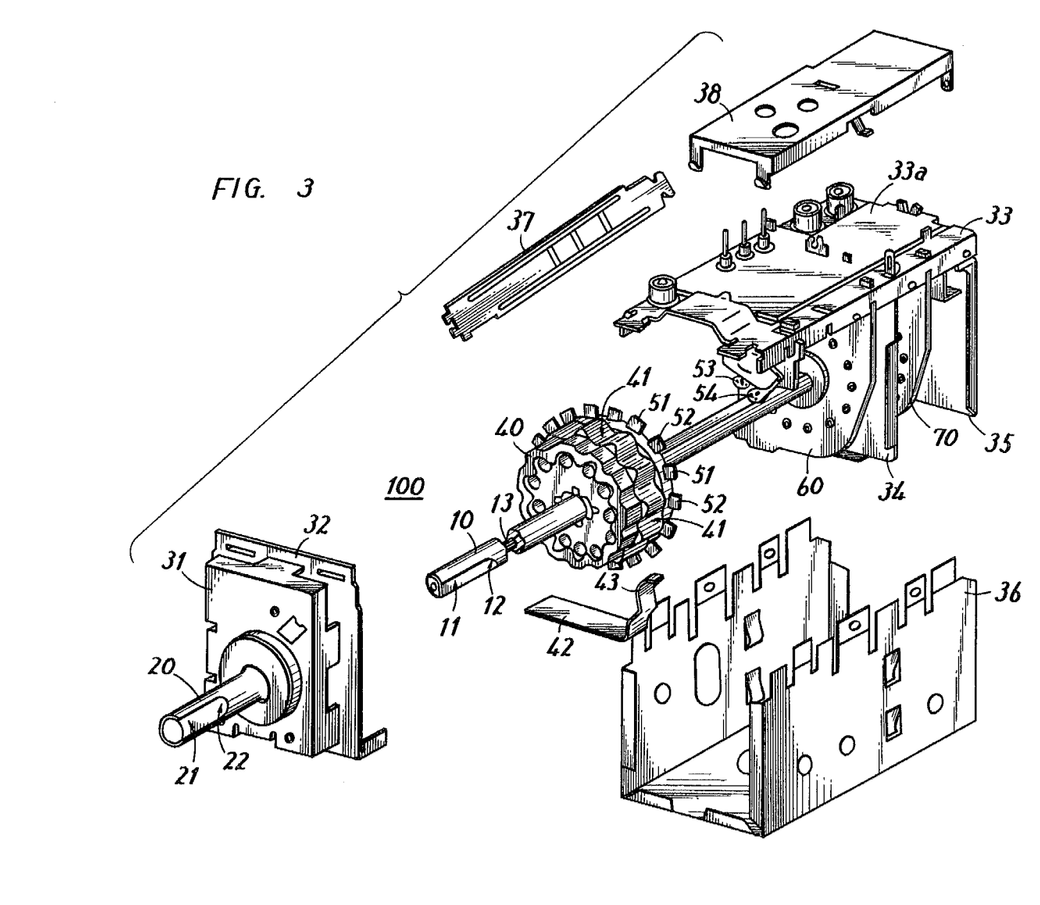
FIG. 3 is an exploded perspective view of a preset type rotary type television tuner using a rotary shaft according to the invention.

FIG. 3 shows a preset type rotary type television tuner using a rotary shaft according to the present invention. In constructional aspect, the channel changing shaft 10 has a detent rotor 40 integrally fixed thereto. The detent rotor 40 has a plurality of recesses 41 formed on the peripheral surface thereof associated with the television channels. A spring plate 42 is fixed to a chassis plate 32 and is formed with a projection 43 at its front end engageable with said recesses 41. Therefore, the rotation of the changing shaft 10 causes the rotation of the detent rotor 40, with the projection 43 on the spring plate 42 engaging the successive recesses 41, so that the rotor 40, i.e., the shaft 10 can be positioned at any desired position associated with the corresponding channel.

Disposed rearwardly of the detent rotor 40 (as viewed in the figures) is a changing plate 50 fixedly mounted on the shaft 10 for rotation therewith. The outer peripheral surface of the changing plate 50 is formed with terminals 51 and 52 projecting therefrom. The rear surface of the changing plate is provided with 13 tuning coils (not shown) for the Channels 1-12 and UHF Channel, each pair of said terminals serving as the leading terminals for the corresponding tuning coil. Therefore, in accordance with the rotation of the channel changing shaft 10, the changing plate 50 is rotated and a pair of terminals 51 and 52 are clamped by contact clips 53 and 54, whereby the tuning coil corresponding to the associated channel is selected.

The channel changing shaft 10 is inserted in holes formed substantially centrally in a switching plate 60, chassis plate 34, switching plate 70 and chassis plate 35 which are fixed to a chassis frame 33. The channel changing shaft 10 is provided at its opposite sides opposed to the switch base plates 60 and 70 with unillustrated blades fixed thereto so that they can be rotated integrally with said shaft 10. Such blades are rotated with the rotation of the channel changing shaft 10 and brought into contact with a plurality of unillustrated contacts formed on the switching plates 60 and 70. Therefore, by designing the blade shape and contact length in accordance with the individual channels, individual inter-stage tuning elements (not shown) attached to the switch base plate 60 and individual high frequency input stage tuning elements (not shown) attached to the switch base plate 70 and associated with the corresponding channels can be selected with respect to the corresponding channels. In addition, a printed plate 33a having amplifying transistors, etc., attached thereto is fixed to the chassis frame 33 and a shield plate 38 is attached to said printed plate 33a.

A shield plate 36 is attached to the bottom of the chassis frame 33 so as to cover the detent rotor 40, changing plate 50, switching plates 60 and 70 and chassis plates 34 and 35 to prevent spurious radiation, etc. The elements 60, 34, 70 and 35 are fixedly supported by a support plate 37.

A known presetting mechanism 31 is attached to a chassis plate 32 disposed forwardly of the detent rotor 40 (as viewed in the figures). A fine tuning shaft 20 is rotatably mounted on the channel changing shaft 10 and connected to the presetting mechanism 31. The present invention relates to the channel changing shaft 10, and since such television tuner 100 is well known, a description of the details will not be given herein.

Figure 4:
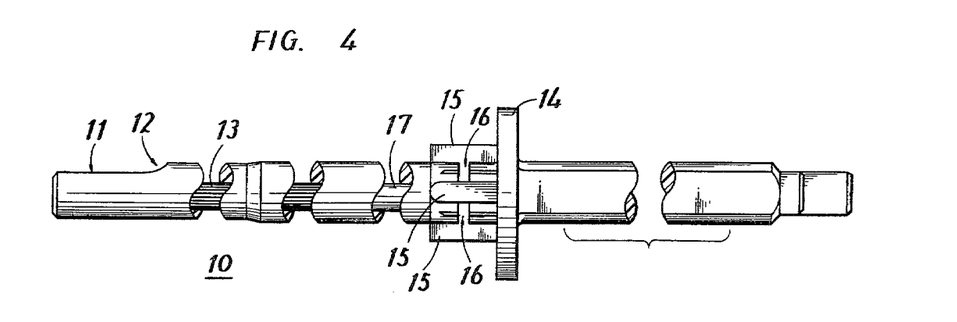
FIG. 4 is a side view of the channel changing shaft 10 shown in FIG. 3.

The channel changing shaft 10, which is shown in detail in FIG. 4, is produced by molding a synthetic resin, e.g., polyphenylene sulfide, polyamide or polycarbonate. On the operating knob side at the front end of the shaft, it is formed with a flat portion 11 for mounting a knob (not shown) thereon. Therefore, the cross-sectional shape of the front end of the shaft 10 is nearly circular. The root of the flat portion 11 is rounded as at 12. Nearly at the middle of the channel changing shaft 10, it is formed with a flange 14 serving to retain the aforesaid changing plate 50. Further, the shaft 10 is formed with a plurality (four, in a certain example) of ridges 15 adapted to engage holes in the changing plate 50 and detent rotor 40 to rotate them. The portion of the shaft 10 where said ridges 15 are formed is somewhat thicker than the other portions.

Figure 5:
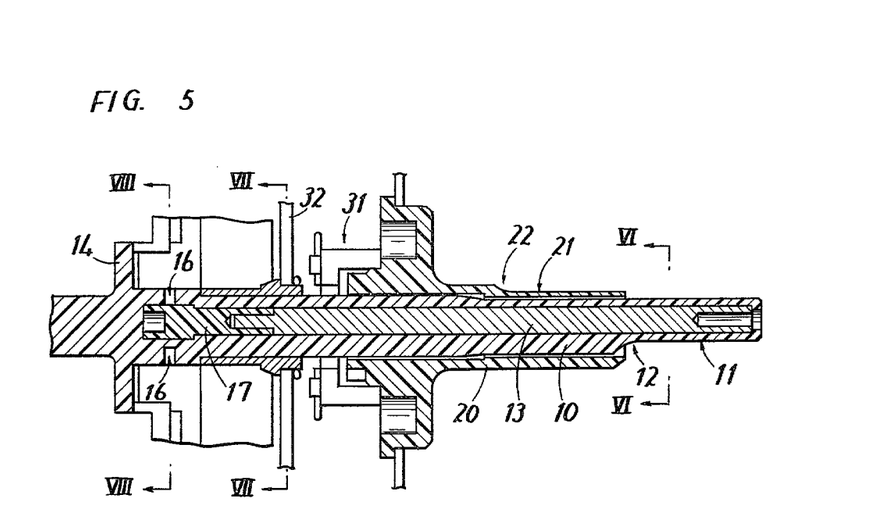
FIG. 5 is a view, partly in section, showing the principal construction of the television tuner 100 shown in FIG. 3.

A reinforcing rod 13 made of a metal, e.g., iron or ferroalloy, and a reinforcing rod 17 made of a rigid synthetic resin, e.g., phenol resin, epoxy resin or rigid vinyl chloride, are embedded in the channel changing shaft 10, as best seen in FIG. 5 showing a cross-section thereof. The reinforcing rod 17 is integrally joined to the reinforcing rod 13 as by threading or knurling. In addition, it would be most preferable from the standpoint of mechanical strength to use a single such reinforcing rod made entirely of a metal and embed it in the channel changing shaft 10 throughout the length thereof. In that case, however, it would result in producing an interference between the high frequency input stage and the inter-stage tuning stages or producing spurious radiation. Thus, such design is not preferable. According to the invention, therefore, the length of the reinforcing metal rod 13 is such that, when assembled as the tuner, it extends from the front end of the shaft 10 to a place in the vicinity of the chassis plate 32. In a more preferable embodiment of the invention, in order to compensate for the decrease of the reinforcing effect due to the reduction of the length of the reinforcing metal rod 13, a reinforcing rod made of a rigid synthetic resin, such as the rod 17, is used. Therefore, the reinforcing assembly, as a whole, has a length such that it extends from the front end of the shaft 10 almost to the position of the flange 14. As for the respective lengths of the reinforcing rods 13 and 17, a maximum length allowable from the standpoint of electrical characteristics is selected for the rod 13 and then a length which agrees therewith is assigned to the rod 17.

Figure 6:
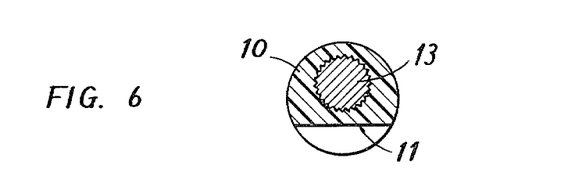
FIG. 6 is a sectional view associated with the shaft 10 taken along the line VI—VI of FIG. 5.
Figure 7:
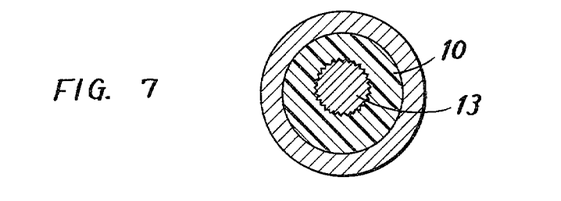
FIG. 7 is a sectional view associated with the shaft 10 taken along the line VII—VII of FIG. 5.
Figure 8:
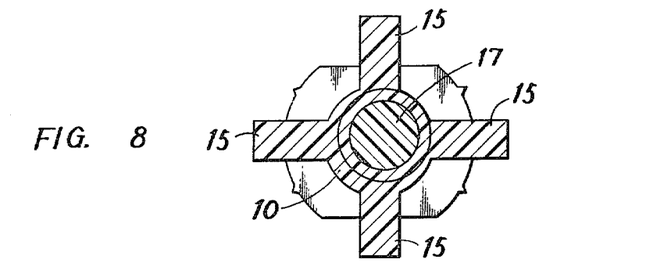
FIG. 8 is a sectional view associated with the shaft 10 taken along the line VIII—VIII of FIG. 5.
Figure 9:
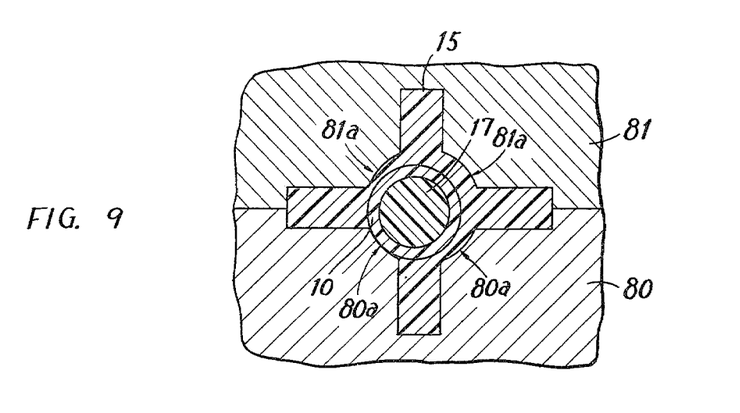
FIG. 9 is a diagrammatic view showing a preferred metal mold construction for producing the shaft 10 of FIG. 4.

FIGS. 6, 7 and 8 are sectional views taken along the lines VI—VI, VII—VII and VIII—VIII, respectively, of FIG. 5. As can be seen in FIGS. 5 and 6 through 8, the reinforcing metal rod 13 is preferably formed with a pin-receiving hole at its front end for the purpose of positioning the same and is knurled around its peripheral surface. Further, the reinforcing synthetic resin rod 17 is positioned at a predetermined position in the cross-section of the shaft 10 inside a metal mold. More particularly, split metal mold halves 80 and 81, as shown in FIG. 9, are used. The metal mold halves 80 and 81 are formed with projections 80a and 81a, resulting in recesses or holes 16 (FIGS. 4 and 5) in the shaft 10. By means of the projections 80a and 81a, the reinforcing rod 17 is positioned, as shown in FIG. 9. The reinforcing rod 13 is positioned in that a pin (not shown) provided on another metal mold (not shown) engages the pin-receiving hole in the front end of the reinforcing rod 13. Therefore, the reinforcing rods 13 and 17 are molded in such a condition that they are embedded in the shaft 10 substantially coaxially of the latter, as shown in FIG. 5. While a 2-part split metal mold has been shown in this example, at the sacrifice of simplicity a 4-part split metal mold may be used in which each part is provided with a pin for positioning the reinforcing rod 17 so that after it is retained at a predetermined position by the 4 pins, molding can be carried out. In addition, the holes 16 formed by the projections 80a and 81a on the metal mold halves 80 and 81 are not preferable from the standpoint of mechanical strength. However, such undesirable factor could be almost neglected if the volume of the projections 80a and 81a, i.e., the volume occupied by the holes 16, is reduced as much as possible. In order to reduce said volume as much as possible, the shape and size of the projections 80a and 81a may be reduced to the lowest minimum that is still sufficient to retain the reinforcing rod 17. For example, the projections 80a and 81a may be reduced in thickness or chamfered. Preferably, the holes 16 are located on the somewhat thicker portion of the shaft 10, i.e., the portion where the ridges 15 are formed, as shown in FIGS. 4 and 5.

Figure 11:
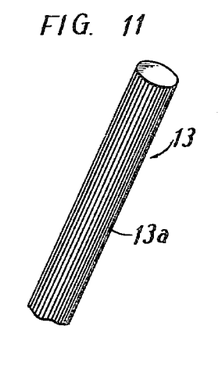
FIGS. 11, 12 and 13 are diagrammatic views showing different modifications of a reinforcing metal rod which can be used in the invention.
Figures 12, 13:
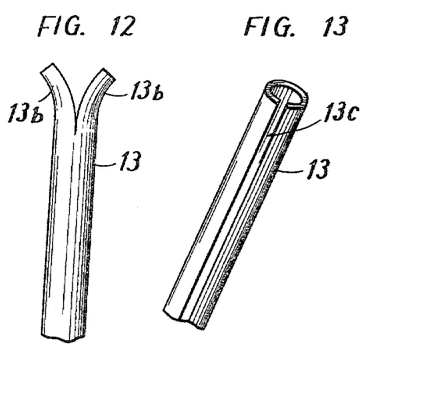

In the above embodiment, the reinforcing rods 13 and 17 have been described as being embedded by solid molding or inserted molding. However, it is also possible to form the shaft 10 with a hole capable of receiving the reinforcing rods 13 and 17, and then insert the separately formed reinforcing rods 13 and 17 into said hole. In that case, as a matter of course, an adhesive for prevention of slipping out may be used. As for the reinforcing rod 13 to be embedded, those forms which are shown in FIGS. 11, 12 and 13 may be used. In FIG. 11, the rod 13 is formed with knurls 13a; in FIG. 12, one end of the rod 13 is formed with split pin legs 13b; and in FIG. 13, the rod 13 is in the form of a hollow cylinder having a slit 13c. Particularly the rods shown in FIGS. 12 and 13 have springiness, so that adhesives can be dispensed with.

As for the material of the channel changing shaft 10 of the present invention, those materials are selected which satisfy all of the requirements; mechanical strength, rigidity, chemical resistance, heat resistance, moisture proofing, and flame resistance. For example, polyphenylene sulfide, polyamides and polycarbonates are used. Even when such resin is used, it is preferable to mix the resin with about 30–40% of glass fiber having a diameter, e.g., of about 1–2μ and a length, e.g., of about 0.3–0.4 mm in order to further increase the mechanical strength. The incorporation of such glass fiber, however, is not essential. Even such resins mixed with glass fiber have the only disadvantage; they are lacking in impact resistance. Thus, according to the invention, the root of the flat portion 11 is rounded as at 12. The effect of the rounding 12 will now be described with reference to FIGS. 10A and 10B.

Figure 10A:
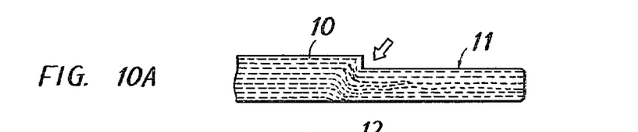
FIG. 10 is a diagrammatic view showing the orientation of a filler inside the shaft 10 for explanation of the effect of the invention.
Figure 10B:
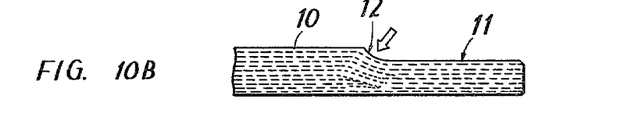

As shown in FIG. 10A, if the root is not rounded, but right-angled, as in the case of a conventional metal shaft, a concentrated stress is applied in the direction of arrow when the operating knob (not shown) is manipulated, whereby the shaft is cracked or broken at this portion. In contrast therewith, as shown in FIG. 10B, if it is rounded as in the present invention, the stress in the direction of arrow can be distributed. Thus, such rounding 12 gives this portion a thicker material and an effective reinforcement.

As for the material of the shaft 10, as described above, a resin mixed with glass fiber is used, whereby the mechanical strength is increased. Such resin is injected at the other end (the left side, in FIGS. 10A and 10B) of the shaft 10. Therefore, the resin flows from left to right in the figures. At this time, if the root is right-angled as shown in FIG. 10A, the resin would dash against the inner wall of the metal mold (not shown) to form the right-angled root and would become a turbulent flow. Therefore, the orientation of the glass fiber becomes random, as shown in FIG. 10A, making it impossible to obtain a sufficient strength in spite of the deliberate incorporation of glass fiber. Further, with a resin mixed with glass fiber, the rate of shrinkage greately varies with the direction of fiber, and hence the size varies, becoming unstable. Now, the provision of the rounding 12 as shown in FIG. 10B assures the smooth flow of the resin and the definite orientation of the glass fiber. As a result, the mechanical strength and dimensional stability are improved, as compared with the construction shown in FIG. 10A.

The merits of the invention will be further described by reference to test data.

Concerning impact resistance, tests were performed by fixing the shaft 10 at a place closest to the flat portion 11 and applying to the front end of the synthetic resin shaft 10 an impact exerted by a free falling 1 kg load dropped from a height of 70 cm. As a result, test samples having a right-angled root as shown in FIG. 10A became rejects after only a single test, whereas test samples having a rounded root 12 as shown in FIG. 10B became rejects after 3–5 tests. Forms of FIG. 10B plus the reinforcing rods 13 and 17 of FIG. 5 embedded therein did not become rejects even after more than 20 tests.

As for mechanical strength tests, the shaft 10 was fixed at its portion closest to the flat portion 11 and a force was applied to the front end thereof. As a result, cracks started when an about 18 kg load was applied in the case of the right-angled root as shown in FIG. 10A, whereas in the case of the rounded root 12 as shown in FIG. 10B, cracks started when an about 25 kg load was applied. In the case of the form of FIG. 10B plus the reinforcing rods 13 and 17 embedded therein, no cracks started until the load was increased to 31 kg.

The fine tuning shaft 20 as well as the channel changing shaft 10 may be rounded as at 21, when the same effect can be expected.

Further, since the channel changing shaft 10 is molded of a synthetic resin, the flange 14 for prevention of the movement of the detent rotor 40 and changing plate 50 can be easily formed. In a conventional tuner, the chambers separated from each other by the chassis plate 34 are connected by a metal shaft, adversely influencing their electrical characteristics, but the present invention is free from such connection. Further, whereas it has heretofore been necessary to provide grounding springs to compensate for the unstable contact between the chassis plates 34, 35 and the shaft 10, in the present invention such grounding springs are no longer necessary since the shaft is an insulator. For the same reason, end insulators which have been necessary in the past are not required. Therefore, the shaft of the invention is most suitable for use as a channel changing shaft for television tuners which handle high frequency signals.

In addition, while the television tuner 100 has been described as being of the preset type, it may be of the known manual type.

Figure 14:
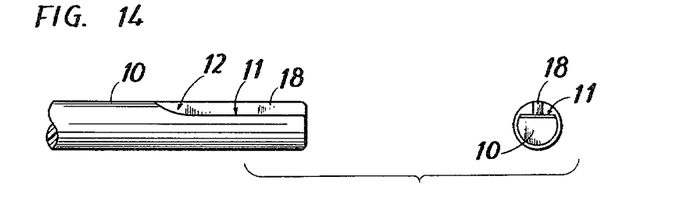
FIGS. 14, 15, 16 and 17 are diagrammatic views showing different modifications of the front end portion of the shaft 10.
Figure 15:
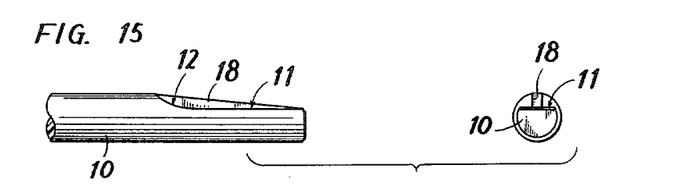
Figure 16:
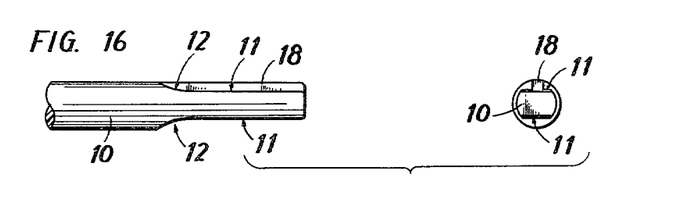
Figure 17:
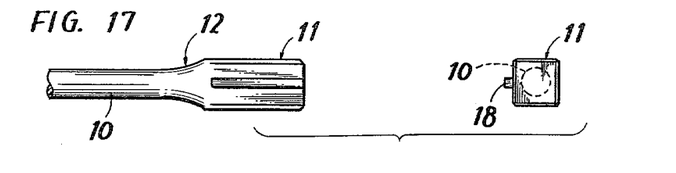

Further, the invention is susceptible of modifications, as shown in FIGS. 14 through 16. More particularly, the shaft may be formed with a ridge 18 extending axially of the flat portion 11 to provide for the mounting of the knob. In FIG. 15, such ridge 18 is inclined toward the front end of the shaft 10. In FIG. 16, the shaft is formed with two opposed flat portions 11 and a ridge 18 is formed on one of said flat portions. In FIG. 17, the cross-section of the knob mounting portion is a square with each side greater than the diameter of the shaft 10, thereby providing flat portions 11, and a ridge 18 is formed on one of the four sides. The provision of such ridge 18 substantially increases the cross-sectional area and mechanical strength and is effective particularly when the shaft is molded of a synthetic resin.

Besides the rotary type television tuner described above, the invention would also be applicable to rotary switches in general. When the reinforcing rods are used, the rounding at the root of the flat portion is not absolutely necessary.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A rotary shaft for use in a television tuner having a shield casing and a rotary switch including a plurality of electronic switching portions disposed therein along said rotary shaft, said shaft adapted to rotate said switching portions of said rotary switch for the selection of a plurality of television channels, said shaft comprising:

an elongated solid rod circular in section and molded of a synthetic resin material, said rod having a flat at one end thereof lying along a chord of the cross section of said shaft in a plane substantially prallel to the longitudinal axis of said shaft with an arcuate transitional surface joining said flat to the remainder of said shaft, said flat adapted to engage a control knob;

said shield casing supporting said shaft and being partitioned into a plurality of compartments, each enclosing an individual switching portion of said rotary switch;

said rotary shaft extending through each said plurality of compartments.

2. A rotary shaft for a rotary switch in accordance with claim 1, wherein said synthetic resin material is a selected from the group consisting of polyphenylene sulfide resin, polycarbonate resin and polyamide resin.

3. A rotary shaft for a rotary switch in accordance with claim 2, wherein said rotary shaft further comprises glass fiber admixed in said synthetic resin material.

4. A rotary shaft for a rotary switch in accordance with claim 3, wherein said glass fiber is admixed in said synthetic resin material in the range of 30 to 40 percent in volume.

5. A rotary shaft for use in a rotary switch in accordance with claim 1, wherein a ridge protrudes from said flat portion in the direction normal to the plane of said flat portion and extends in the direction parallel with said axis of said rotary shaft.

6. A rotary shaft for a rotary switch in accordance with claim 5, wherein said ridge tapers from said arcuate transitional surface to said one end of said flat 7. The rotary shaft of claims 1 ro 8 wherein said arcuate transitional surface functions to relieve strains within said shaft at the juncture of said flat and the rest of said shaft.

8. A rotary shaft for use in a television tuner having a shield casing and a rotary switch including a plurality of electronic switching portions disposed therein along said rotary shaft, said shaft adapted to rotate said switching portions of said rotary switch for the selection of a plurality of television channels, said shaft comprising:

an elongated solid rod circular in section and molded of a synthetic resin material, said rod having a flat at one end thereof lying along a chord of the cross section of said shaft in a plane substantially parallel to the longitudinal axis of said shaft with an arcuate transitional surface joining said flat to the remainder of said shaft, said flat adapted to engage a control knob; and a reinforcing rod embedded in said elongated solid rod, said reinforcing rod extending at least the length of said shaft flat;

said shield casing supporting said shaft and being partitioned into a plurality of compartments, each enclosing an individual switching portion of said rotary switch;

said rotary shaft extending through each of said plurality of compartments.

9. A rotary shaft for a rotary switch in accordance with claim 8, wherein the outer surface of said reinforcing rod has ridges formed thereon to more securely fasten said reinforcing rod within said elongated solid rod.

10. A rotary shaft for a rotary switch in accordance with claim 8, wherein said reinforcing rod is made of a metal.

11. A rotary shaft for a rotary switch in accordance with claim 10, wherein said metal is iron or an ferroalloy.

12. A rotary shaft for a rotary switch in accordance with claim 8, wherein said reinforcing rod composite includes a first portion made of a metal and a second portion made of a rigid synthetic resin material, said first and second portions being coupled in the longitudinal direction.

13. A rotary shaft for a rotary switch in accordance with claim 12, wherein said rigid synthetic resin material is stranger than said synthetic resin material for said rotary shaft.

14. A rotary shaft for a roatary switch in accordance with claim 13, wherein said rigid synthetic resin material is a member selected from the group consisting of phenol resin, epoxy resin and rigid vinyl chloride.

15. A rotary shaft for a rotary switch in accordance with claim 14, wherein said television tuner comprises said rotary switching portion, electrical components associated with said rotary switching portion, and a chassis covering a portion of said rotary shaft, said reinforcing rod being of sufficient length to reach the position of said chassis.

16. A rotary shaft for a rotary switch in accordance with claim 8, wherein said synthetic resin material of said rotary shaft is a member selected from the group consisting of polyphenylene sulfide resin, polycarbonate resin and polyamide resin.

17. A rotary shaft for a rotary switch in accordance with claim 16, wherein said rotary shaft further comprises glass fiber admixed in said synthetic resin material of said rotary shaft.

18. A rotary shaft for a rotary switch in accordance with claim 8, which further comprises a ridge protruding from said flat portion in the direction normal to the plane of said flat portion and extending in the direction parallel with said axis of said rotary shaft.

19. A rotary shaft for a rotary switch in accordance with claim 8, wherein said reinforcing rod is embedded by an insert molding process using a metal mold.

20. A rotary shaft for a rotary switch in accordance with claim 19, wherein said metal mold comprises a supporting member for positioning said reinforcing rod along said axis of said rotary shaft in said insert molding process.

21. A rotary shaft for a rotary switch in accordance with claim 8, wherein an aperture is formed in said rotary shaft extending from the tip end thereof along said axis of said rotary shaft, said reinforcing rod being inserted into said aperture.

22. A rotary shaft for a rotary switch in accordance with claim 21, wherein means is further provided for preventing said reinforcing rod from slipping out from said aperture.

23. A rotary shaft for a rotary switch in accordance with claim 22, wherein said slippage preventing means comprises an adhesive agent.

24. A rotary shaft for a rotary switch in accordance with claim 22, wherein said slippage preventing means comprises a member having resiliency.

25. A rotary shaft for use in a rotary switch having a plurality of switching portions comprising:
an elongated solid rod circular in section and molded of an synthetic resin material, said rod having a flat at one end thereof lying along a chord of the cross section of said shaft in a plane substantially parallel to the longitudinal axis of said shaft with an arcuate transitional surface joining said flat to the remainder of said shaft;
said rod further including a ridge protruding from said flat portion in the direction normal to the plane of said flat portion and extending in the direction parallel with said axis of said rotary shaft.

26. A rotary shaft for a rotary switch in accordance with claim 25, wherein said ridge tapers from said arcuate transitional surface to said one end of said flat.

27. A rotary shaft for use in a rotary switch having a plurality of switching portions comprising:
an elongated solid rod circular in section and molded of a synthetic resin material, said rod having a flat at one end thereof lying along a chord of the cross section of said shaft in a plane substantially parallel to the longitudinal axid of said shaft with an arcuate transitional surface joining said flat to the remainder of said shaft; and
a reinforcing rod embedded in said elongated solid rod;
said reinforcing rod including a first portion made of a metal and a second portion made of a rigid synthetic resin material; said first and second portions being coupled in the longitudinal direction;
said reinforcing rod extending at least the length of said flat.

28. A rotary shaft for a rotary switch in accordance with claim 27, wherein rigid synthetic resin material is stronger than said synthetic resin material for said rotary shaft.

29. A rotary shaft for a rotary switch in accordance with claim 28, wherein said rigid synthetic resin material is a member selected from the group consisting of phenol resin, epoxy resin and rigid vinyl chloride.

30. A rotary shaft for use in a rotary switch having a plurality of switching portions comprising:
an elongated solid rod circular in section and molded of a synthetic resin material, said rod having a flat at one end thereof lying along a chord of the cross section of said shaft in a place substantially parallel to the longitudinal axis of said shaft with an arcuate transitional surface joining said flat to the remainder of said shaft;
said rod further including a ridge protruding from said flat portion in the direction normal to the plane of said flat portion and extending in the direction parallel with said axis of said rotary shaft, and
a reinforcing rod embedded in said elongated solid rod, said reinforcing rod extending at least the length of said shaft flat.

31. The rotary shaft according to claims 1, 25, 27, or 30, wherein said shaft does not adversely affect signals passed through said switching portions of said rotary switch.

32. A rotary shaft for use in a television tuner having a shield casing and a rotary switch including a plurality of electronic switching portions disposed therein along said rotary shaft, said shaft adapted to rotate said switching portions of said rotary switch for the selection of a plurality of television channels, said shaft comprising:
an elongated solid rod circular in section and molded of a synthetic resin material, said rod having a flat at one end thereof lying along a chord of the cross section of said shaft in a plane substantially parallel to the longitudinal axis of said shaft, said flat adapted to engage a control knob;
said shield casing supporting said shaft and being partitioned into a plurality of compartments, each enclosing an individual switching portion of said rotary switch;
said rotary shaft extending through each of said plurality of compartments.

33. The rotary shaft of claim 32 wherein said television tuner includes a detent rotor positioned on said shaft for positively locating said shaft to ensure a positive selection of one of said plurality of television channels, said rotary shaft further comprising:
a flange molded into said elongated solid rod, said detent motor being positioned against said flange to thereby positively locate said detent rotor on said shaft.

34. The rotary shaft of claim 33 further comprising:
a plurality of axially aligned ridges disposed adjacent to said flage and lying substantially parallel to the logitudinal axis of said shaft, said ridges positively securing said detent rotor to said shaft.

* * * * *